(12) United States Patent
Pachler

(10) Patent No.: US 9,252,342 B2
(45) Date of Patent: *Feb. 2, 2016

(54) LED MODULE WITH IMPROVED LIGHT OUTPUT

(75) Inventor: Peter Pachler, Graz (AT)

(73) Assignee: TRIDONIC JENNERSDORF GMBH, Jennersdorf (AT)

( * ) Notice: Subject to any disclaimer, the term of this patent is extended or adjusted under 35 U.S.C. 154(b) by 252 days.

This patent is subject to a terminal disclaimer.

(21) Appl. No.: 13/255,856

(22) PCT Filed: Feb. 26, 2010

(86) PCT No.: PCT/EP2010/052453
§ 371 (c)(1),
(2), (4) Date: Nov. 18, 2011

(87) PCT Pub. No.: WO2010/102910
PCT Pub. Date: Sep. 16, 2010

(65) Prior Publication Data
US 2012/0061709 A1    Mar. 15, 2012

(30) Foreign Application Priority Data

Mar. 9, 2009  (EP) ..................... 09154642
Apr. 8, 2009  (EP) ..................... 09157636

(51) Int. Cl.
*H01L 33/46* (2010.01)
*H01L 33/60* (2010.01)
(Continued)

(52) U.S. Cl.
CPC . *H01L 33/60* (2013.01); *F21K 9/13* (2013.01); *F21Y 2101/02* (2013.01); *H01L 2924/0002* (2013.01)

(58) Field of Classification Search
CPC .................. H01L 33/60; H01L 2924/00014; H01L 2224/8592; F21Y 2101/02; F21K 9/13
USPC ......... 257/98, E25.02, E33.055, E33.056, 89, 257/88, 99; 362/231, 235; 313/512, 498, 313/503, 110, 506; 438/22; 315/250
See application file for complete search history.

(56) References Cited

U.S. PATENT DOCUMENTS

2004/0239242 A1   12/2004  Mano et al.
2006/0012991 A1*  1/2006   Weaver et al. ................. 362/235
(Continued)

FOREIGN PATENT DOCUMENTS

DE  102005062514 A1  3/2007
EP  1160883          12/2001
WO  WO2009033642 A1  3/2009

OTHER PUBLICATIONS

Office action for U.S. Appl. No. 13/255,694, mailed on Apr. 23, 2013, Pachler, "LED Module for Modified Lamps and Modified LED Lamp", 19 pages.

(Continued)

*Primary Examiner* — Kenneth Parker
*Assistant Examiner* — Bo Fan
(74) *Attorney, Agent, or Firm* — Lee & Hayes, PLLC

(57) ABSTRACT

An LED module includes a printed circuit board (PCB) or a surface mounted device (SMD) carrier, an LED chip mounted directly or indirectly on the PCB or SMD carrier, an optical element arranged on top of the LED chip, and a white reflective layer covering a surface of the PCB or SMD carrier on which the optical element is arranged and/or partially covering the optical element.

23 Claims, 11 Drawing Sheets

(51) Int. Cl.
*F21Y 101/02* (2006.01)
*F21K 99/00* (2010.01)

(56) References Cited

U.S. PATENT DOCUMENTS

| | | | |
|---|---|---|---|
| 2006/0138441 A1* | 6/2006 | Kromotis et al. | 257/99 |
| 2007/0018175 A1 | 1/2007 | Mazzochette et al. | |
| 2008/0173883 A1* | 7/2008 | Hussell et al. | 257/98 |
| 2008/0290351 A1* | 11/2008 | Ajiki et al. | 257/88 |
| 2009/0050907 A1* | 2/2009 | Yuan et al. | 257/88 |
| 2009/0236619 A1 | 9/2009 | Chakroborty | |
| 2009/0261366 A1 | 10/2009 | Eisert et al. | |
| 2009/0267093 A1 | 10/2009 | Kamada et al. | |
| 2010/0237766 A1* | 9/2010 | Baumgartner et al. | 313/498 |
| 2012/0068204 A1 | 3/2012 | Pachler | |

OTHER PUBLICATIONS

International Search Report PCT/EP/2010/052459, dated Mar. 30, 2011, 6 pages.

International Search Report PCT/EP2010/052453, dated Sep. 15, 2010, 5 pages.

Non-Final Office Action for U.S. Appl. No. 13/255,694, mailed on Nov. 30, 2012, Peter Pachler, "LED Module for Modified Lamps and Modified LED Lamp," 19 pages.

Office Action for U.S. Appl. No. 13/255,694, mailed on May 8, 2014, Peter Pachler, "LED Module for Modified Lamps and Modified LED Lamp", 19 pages.

Office Action mailed Mar. 12, 2015 in U.S. Appl. No. 13/255,694.

* cited by examiner

LED MODULE WITH IMPROVED LIGHT OUTPUT

This Application is a National Stage of International Application No. PCT/EP2010/052453, filed Feb. 26, 2010, which claims foreign priority to EP Application No. 09 154 642.4, filed Mar. 9, 2009, and EP Application No. 09 157 636.3, filed Apr. 8, 2009, all of which are incorporated herein by reference.

Figure 1:
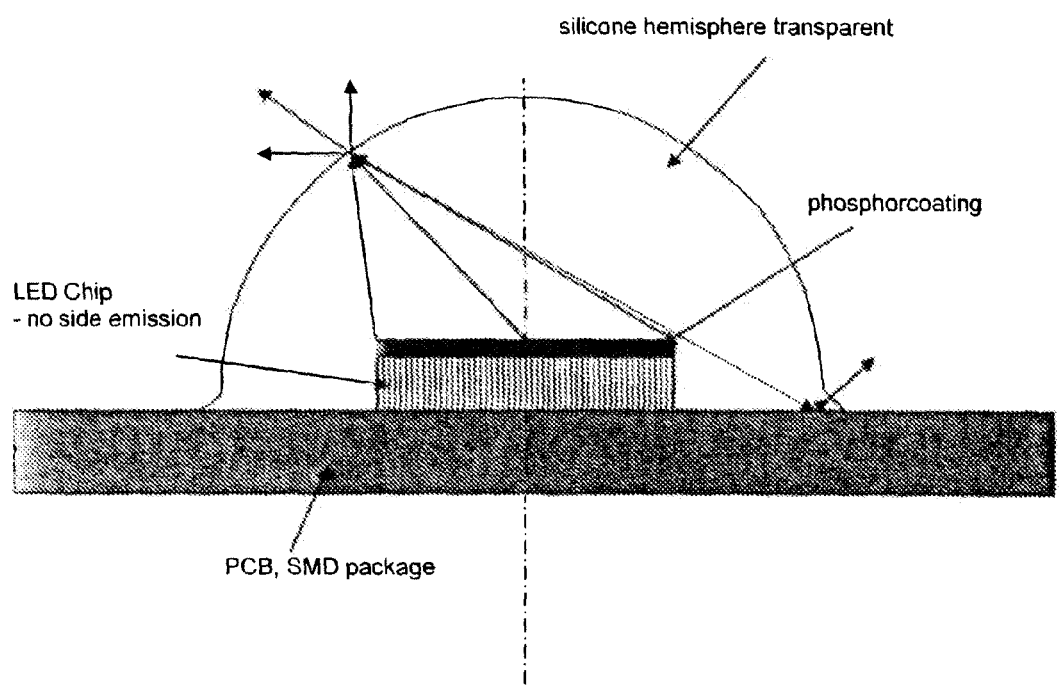

The light output of packaged LEDs in COB (Chip-on-board) technology is influenced by the optical properties of the surrounding package materials, especially the reflectivity and the position of the phosphor and the LED chip. It is important that the packaging materials show:
 a) a high reflectivity
 b) a high photostability
 c) a high thermal stability The typical light paths of emitted radiation of a phosphor-converted white light emitting LED with a coated phosphor on top of the emitting area of the LED chip is shown in FIG. 1. One configuration of a LED is to place the emitter in the middle of a hemisphere to allow the light to pass out the LED package with a minimum of reflection losses. A small percentage of the light is reflected back to the chip and surrounding area of the PCB or SMD package where it is either absorbed or reflected. If the hemispherical globe top is big enough in size, around 3%-5% of the light, depending on the refractive index of the hemisphere material, will be reflected and may be lost. As the phosphor does emit light in all directions, approximately half of the light has to be reflected by the LED chip itself where some additional losses do happen. Although high reflectivity is also a property which should be provided by the LED chip itself, its main function is to emit efficient light which could mean a decrease of its reflectivity.

If high light densities are not needed the phosphor can be also distributed into the hemispherical globe top. This does not obviously give an advantage in light output and path of rays, but the color stability and color reproducibility can be easier controlled and the light densities are not too high meaning less anti-glare efforts have to be done.

As a much bigger portion of the light emitted will fall onto the PCB or SMD package the reflectivity of the PCB or SMD package has big influence on the final light output. As in some cases areas need to be gold wire bonded to connect the chip, distances to keep areas free of solder stop mask have to kept according to design rules, the overall reflectivity of the PCB board or SMD package may be limited or only materials with lower stability can be used.

It is the object of the present invention to improve the light output of a LED module with an element arranged on top of the LED chip, such as e.g. a so-called globe top.

This object is achieved by means of the features of the independent claims. The dependent claims develop further the central idea of the present invention.

According to the invention a LED module e.g. manufactured in Chip on Board (COB) technology or a SMD package carrier, can comprise at least one LED chip mounted on the board or the carrier. After wire-bonding of the LED chip(s) a reflective, preferably white coating is applied to the board or carrier, covering at least the entire area onto which the element like a globe top or hemispherical lens shall be applied. Additionally the white coating may cover parts, such as e.g. parts of the side walls, of the LED chip itself. In case the LED chip has no lateral emission, the coating is preferably carried out with 75% to 90% of the chip thickness, otherwise to get the full effect of the reflectivity improvement with a LED chip with side emission a minimum height should be carried out.

To get an optimum of effectivity in light reflection the reflective white coating preferably is in contact and even overlaps with parts of the chip. An essentially transparent globe top can be dispensed on top of the LED chip and the area of the board or carrier surrounding the LED chip. The surface of the board or carrier on which the globe top is dispensed is covered with white reflective material. Although with a transparent globe top an increase in light output can be achieved, essentially diffuse globe tops filled with color conversion material like phosphors made out of BOSE or YAG or nitrides will have a bigger effect in light output due to the fact that light will be emitted in all direction from the phosphor.

According to the invention, it is possible to use a highly reflective material that is deposited in close connection at the bottom part of the color conversion element. The overall amount of this highly reflecting material is adjusted in a way that a desired light wavelength and/or color temperature can be reached. In addition the reflective material, e.g. reflective particles in a silicone matrix, can be also deposited in a larger overall quantity with a lower volume concentration of reflective materials in order to overcome inaccuracies in dosing. Since this material is in close connection with the substrate and does not contain phosphor particles silicone can be used without the risk of heat degradation.

Generally phosphors for LED applications are known to skilled person in the field of phosphor-converted LEDs.

Additionally scattering material can be present in the globe top or (preformed) hemispherical lens.

Note that a coating applied as a globe top is known to the skilled person in the field of LED packaging.

The reflective material may be a layer having a thickness of between 5 µm to 250 µm, preferably 20-200 µm, more preferably 100 µm-150 µm in case of chips without lateral emission.

The reflective material may be a layer having a top surface, wherein the top surface is lower than the top surface of the LED chip when viewing the LED module from the side with the LED chip on top of the board or carrier.

The reflective material may be a layer having a thickness of between 75% and 90% of the thickness of the LED chip due to the fact that chip height may vary over time due.

Also one or more lateral, preferably vertical side walls of the LED chip may be coated with a material which is arranged to be reflective of the light emitted onto the LED chip.

A color conversion material may be provided in the globe top and/or on the top surface of the LED chip.

The reflective material may be designed to be reflective at least of the spectrum emitted by the LED chip and the color conversion material if present.

The LED module may emit an essentially white light being a mixture of the spectrum of the LED chip and the emission spectrum of color conversion. In addition or alternatively also light outside the visible spectrum can be emitted by the LED module. The wavelength-dependent reflection characteristics will be set accordingly.

The invention also proposes a method for improving the chromaticity coordinate tolerance of a LED module comprising a printed circuit board or a SMD carrier due to stabilizing the reflectivity to a better controllable value especially for COB technology.

Further advantages, features and objects of the present invention will now become evident for the skilled person when reading the following detailed description of an embodiment of the invention, when taken in conjunction with the figures of the enclosed drawings.

Figure 2:
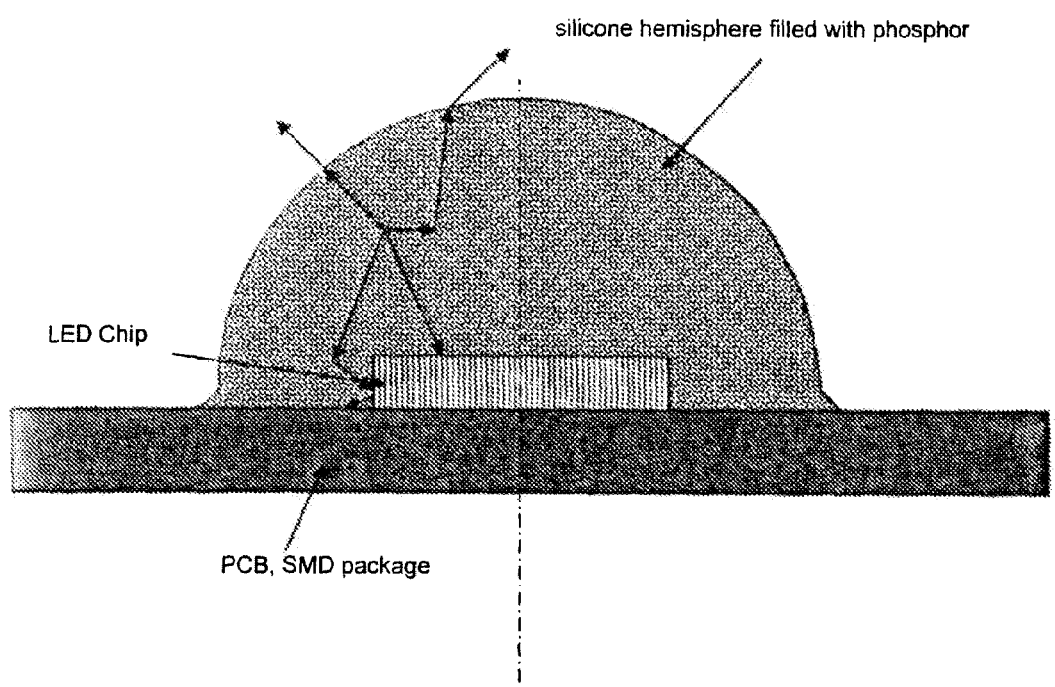
Figure 3:
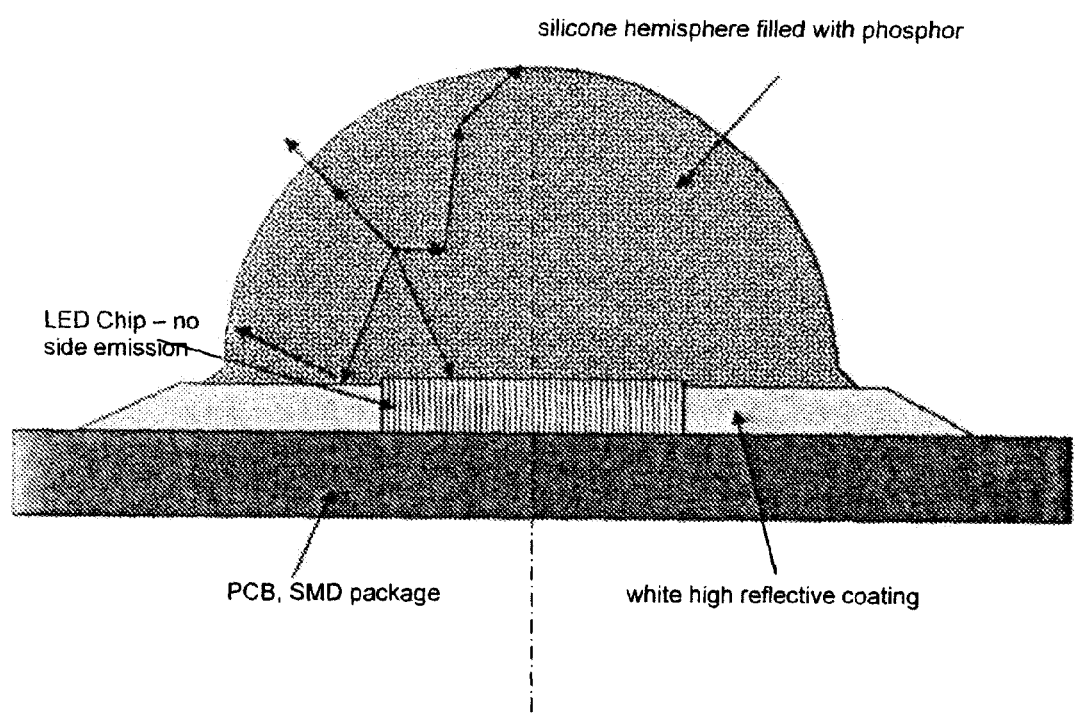
Figure 4:
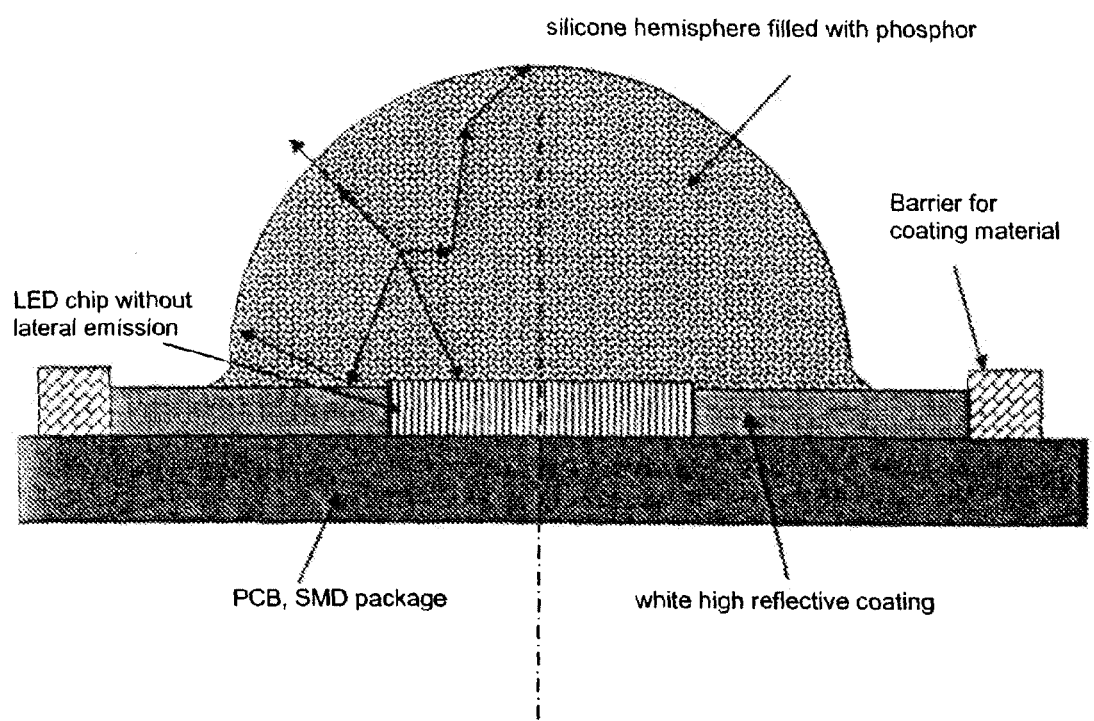
Figure 5:
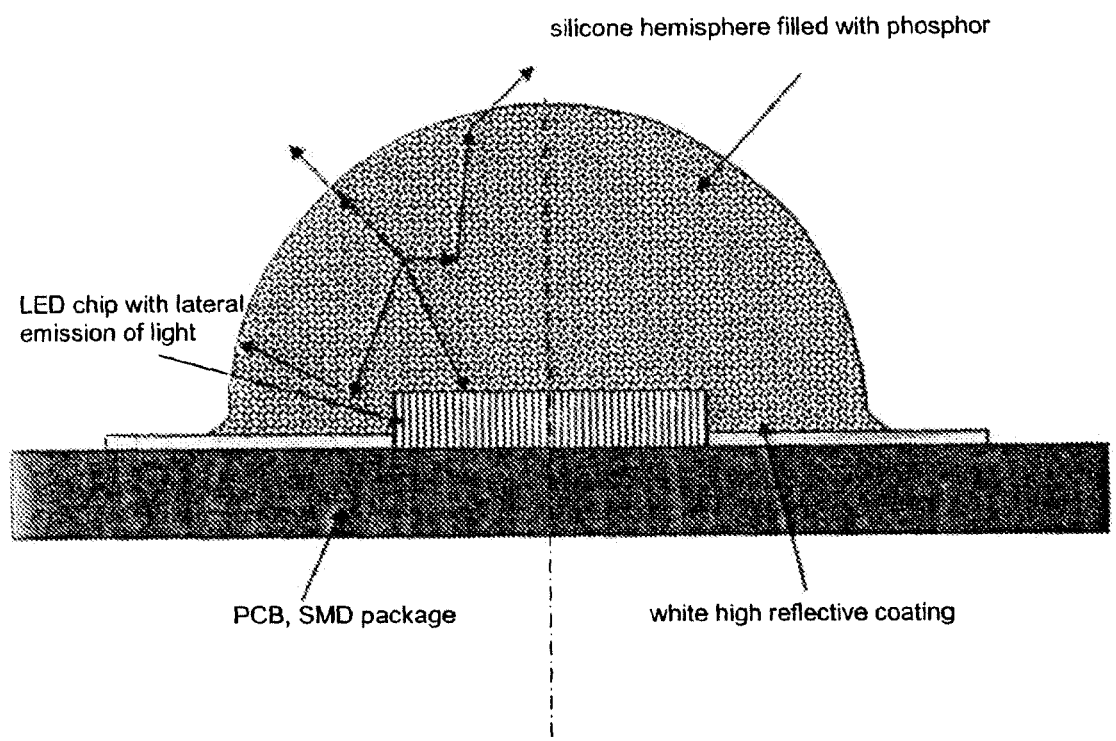
Figure 6:
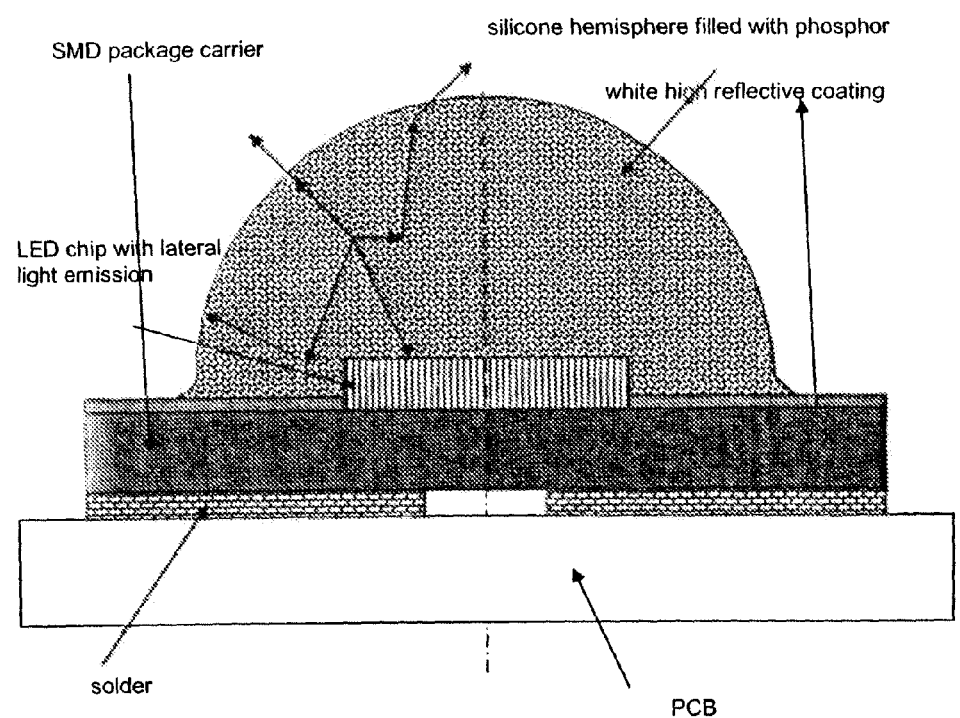
Figure 7:
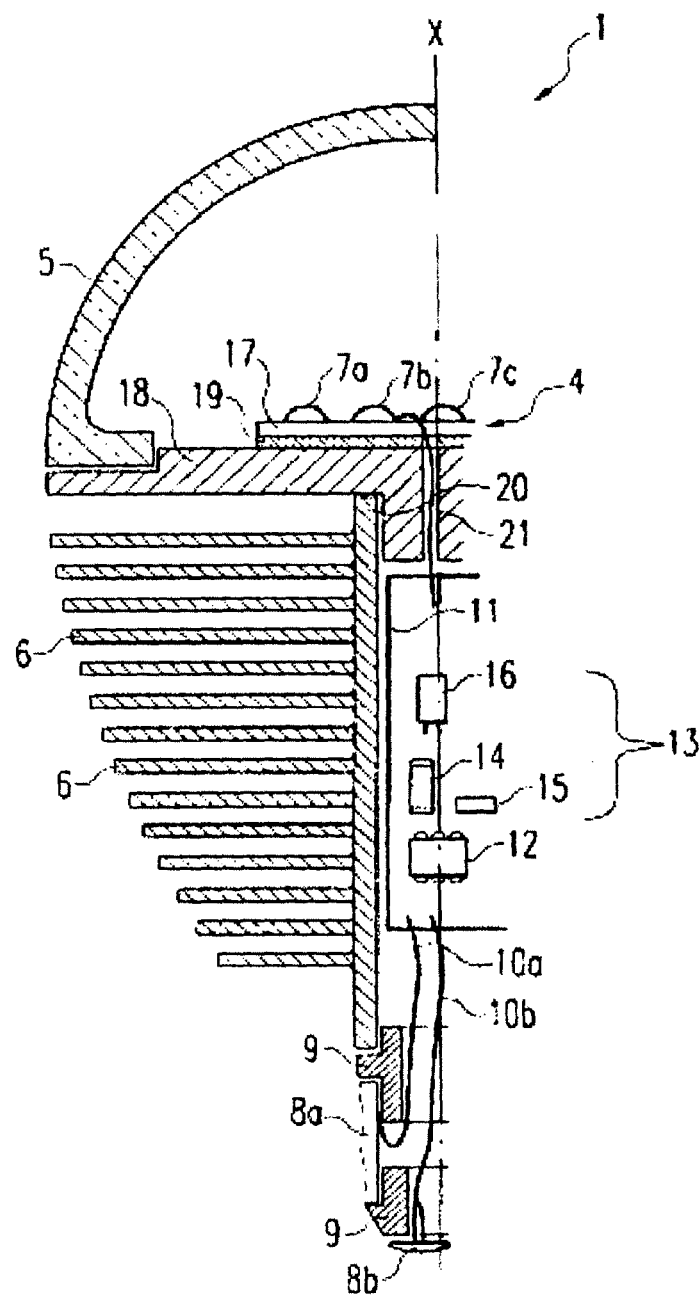
Figure 8:
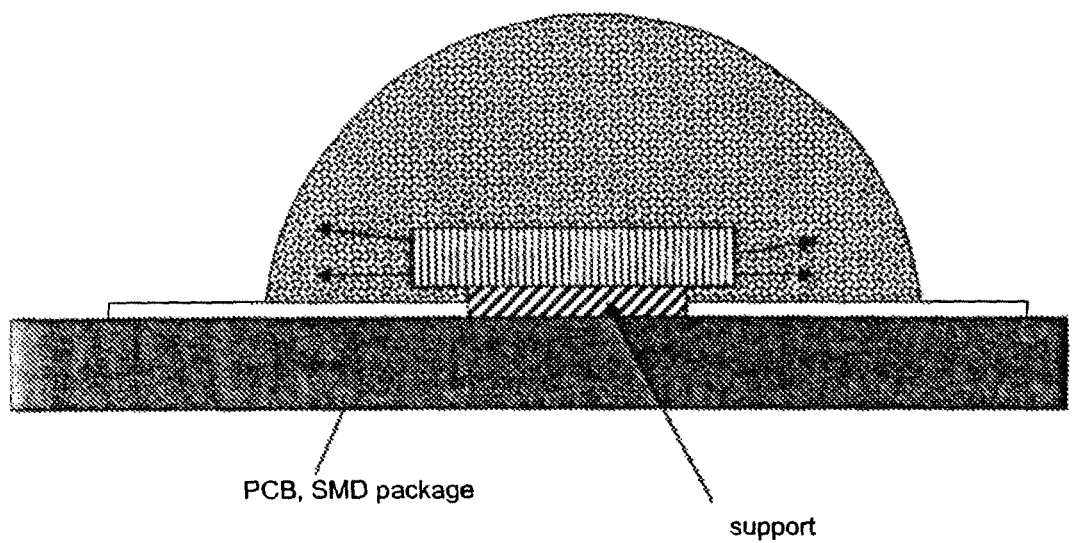
Figure 9:
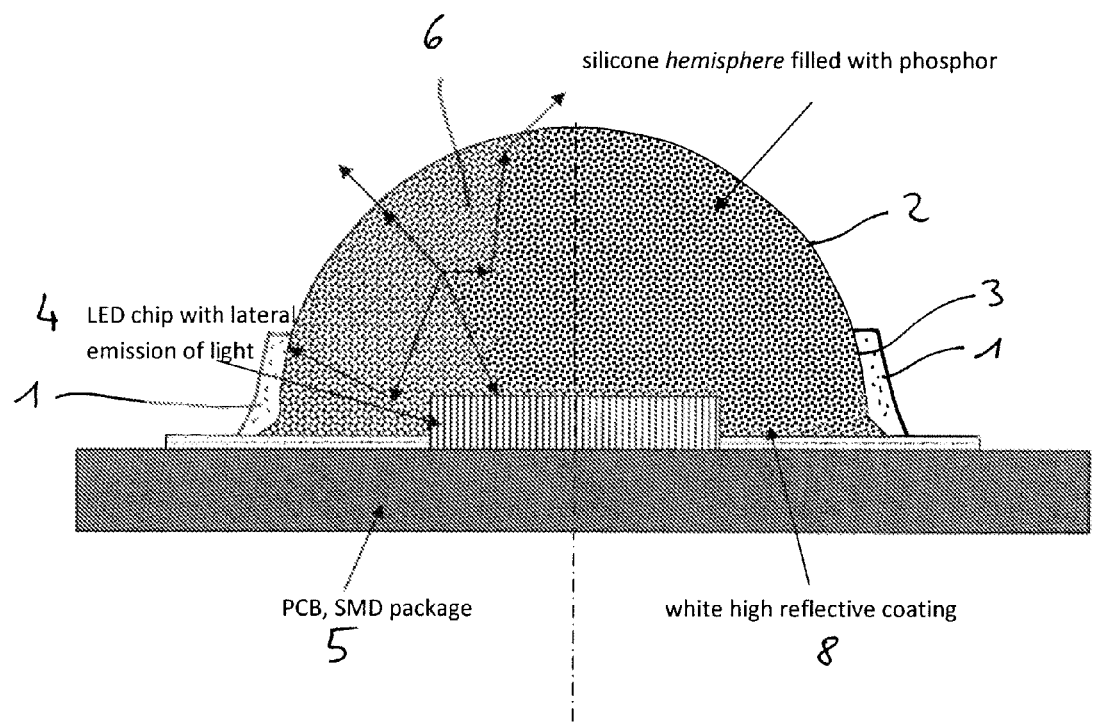
Figure 10:
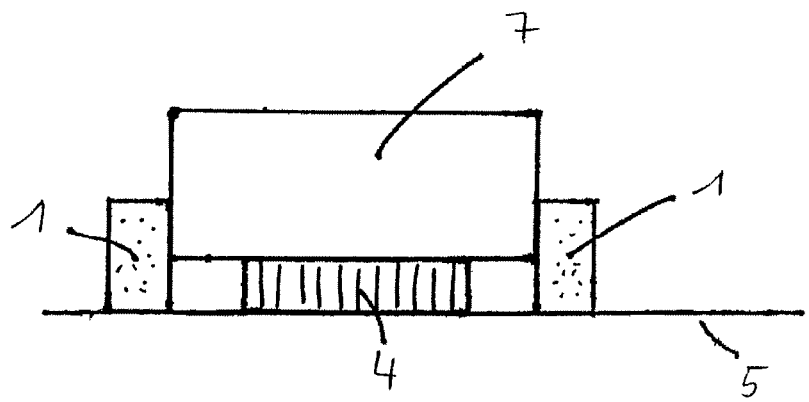
Figure 11:
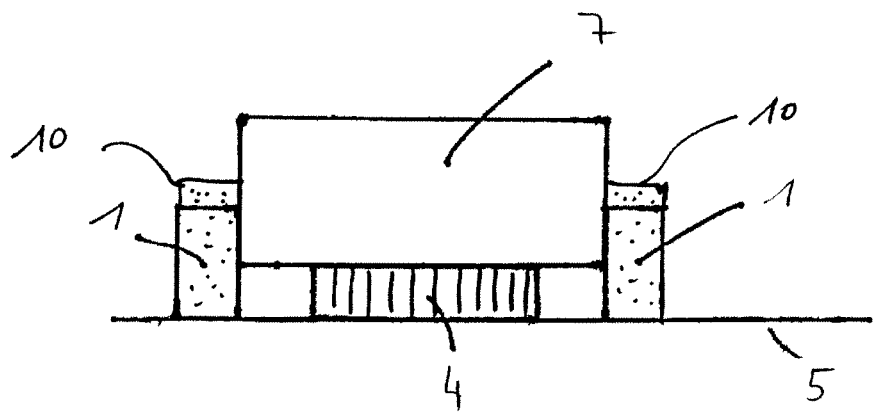
Figure 12:
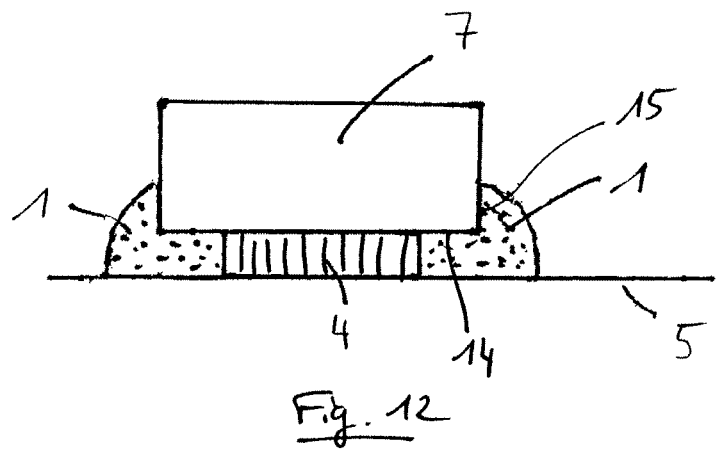
Figure 13:
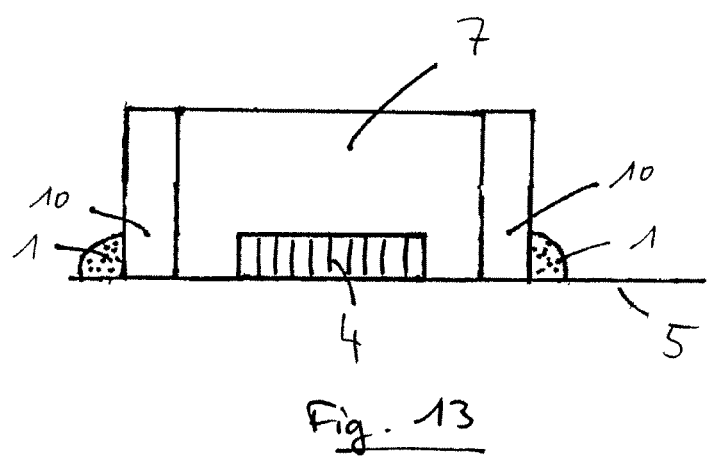

FIG. 1 shows a chip package with phosphor layer representing the state of the art, FIG. 2 shows a chip package with distributed phosphor representing the state of the art, FIG. 3 shows a chip package with white coating according to a preferred embodiment of the invention, FIG. 4 shows a LED chip package with an additional dam to define an outer shape for the white coating, FIG. 5 shows a white coating applied to the LED chip package with a LED chip with lateral emission, FIG. 6 shows a white coating applied to a SMD Package with a LED chip with side emission present, FIG. 7 shows a retrofit Led module, known from DE 202007008258 U1, and in which the present invention can be applied, FIG. 8 shows a further development of the embodiment of FIGS. 5 and 6, FIG. 9 shows a LED chip package with a coating applied to a portion of a globe top according to an alternative embodiment of the invention, FIG. 10 shows a LED chip package with a coating applied to a portion of a preformed element arranged above a LED chip, FIG. 11 shows a LED chip package with an additional coating applied to a portion of a preformed element arranged above a LED chip, FIG. 12 shows a LED chip package with a coating applied to sides of a LED chip and to a portion of a preformed element arranged above the LED chip, and FIG. 13 shows a LED chip package with a coating applied to sides of a housing comprising a LED chip and a preformed element arranged above the LED chip.

To overcome some of the problems shown in FIG. 2 a reflective coating can be applied on the area of the carrier or board, on which the LED chip is mounted and which surrounds the LED chip. The reflective coating may cover all parts with limited reflectivity and especially parts covered by the globe top.

More than one LED chip can be positioned under the same globe top (a globe top being just one example for a phosphor-containing element arranged on top of the LED chips). "Globe top" thus simply stands for an element arranged on top of one or more LED chips.

One or more of these LEDs may emit light blue spectra, which will be partially down-converted by the phosphor.

Additionally one or more LEDs may emit spectra which are essentially not down-converted by the phosphor. This is the case e.g. for at least one red light emitting LED chip covered by a phosphor designed for the down-conversion of blue light.

One embodiment comprises one or more LED chips under an optical element, the optical element comprising one or more phosphors in order to convert the spectrum of at least one of the LED chips, such that the LED module emits a mixed spectrum, which can be e.g. white light, especially warm white light.

Such an arrangement can be used for a retrofit LED module, i.e. a LED module having electric connections comparable to a light bulb or a halogen lamp. Such a retrofit module is shown in DE 202007008258 U1 the disclosure of which is incorporated by reference. Reference is especially made to FIG. 1 of DE 202007008258 U1, which is attached as FIG. 7 to the present specification. The board 4 and LEDs 7 shown in FIG. 7 can be the one according to the present invention.

The globe top can be a dispensed globe top or a preformed essentially hemispherical lens element.

Also the side walls of the LED chip may be coated, as they are usually made based on silicon, a semiconducting material with known low reflectivity. With this design reflectivity constraints can be reduced leading to an optimized output.

Also the advantage to keep lower chromaticity coordinate tolerance relatively to a package shown in FIG. 1 can be achieved.

Commonly used solder resist layers on top of PCBs show a reflectivity of typically below 90%, some down to only 60%. Also, the reflectivity changes for some types with thermal processes in production. Gold pad reflectivity is even worse due to significant absorption of blue light. This can be prevented using pads e.g. made of silver, but migration speed of gold is much less than that of silver which may lead to a lower reliability. To maximize the output a high reflectivity has to be aimed for which can be realized by the reflectivity coating.

The layer of reflective material (white coating) can be applied by standard dispensing techniques and may have a thickness of 5 µm to 250 µm, preferably 20-200 µm, more preferably 100 µm-150 µm.

The LED chip may be attached to its support structure using an adhesive or glue. These materials have the undesired tendency to creep upwards on the lateral walls of the LED chip. The white coating of the present invention preferably has a thickness which is high enough to ensure that the white coating actually contacts the LED chip above any creeping adhesive or glue. To this regard the thickness of the white coating is selected to be higher than the expected creeping height.

Preferably the thickness, measured from the surface of the board or carrier, is around 75%-90% of the thickness of the LED chip. Thus the top surface of the layer of reflective material will be lower, but essentially parallel to the top surface (light emitting surface) of the LED chip. The achieved improvement of light output is in the order of 15% throughout the visible range for white LEDs of, e.g., normal white colour.

Typical pigments used in e.g. a resin matrix of the reflective material are electrically non-conducting materials, such as e.g. TiO2, BaSO3, ZrO2, BaTiO3. Disclosed is also a method to produce such a LED containing a white coating layer.

The layer of reflective material, see FIG. 3, may have slanted side walls, i.e. non-vertical side walls.

The globe top may present the shape of a hemisphere.

Color conversion material may be provided in the e.g. silicone matrix of the globe top and/or on to of the LED chip (compare FIG. 1).

FIG. 4 shows a LED chip package with an additional dam to define an outer shape of the white coating. The dam is preferably formed before the white coating is applied. The dam can be made preferably of a material such as e.g. a silicone-based material and thus of a material different to the material of the white coating.

FIG. 5 shoes an embodiment of a COB package using a LED chip with side emission (side emission=side walls of the chip emit light when using a transparent substrate such as sapphire or SiC). In this case the thickness of the white coating is preferably less than 50% of the height of the LED chip, more preferably less than 25%, most preferred less than 10%.

The embodiment of FIG. 5 may be further developed as shown by FIG. 8 by placing the LED chip on a support the contours of which—in a top view—are equal to or smaller than the contours of the LED chip in at least one dimension. Thus the white coating can optionally flow and thus be present under the bottom face of the LED chip. This support may present a height which is larger than the thickness of the white coating.

Alternatively the area of the support surrounding the LED chip can be recessed e.g. by etching. Both of these features make sure that the white coating, although contacting the side walls of the LED chip, will essentially not cover the lateral light emitting surfaces of the LED chip.

FIG. 6 shows an example of a SMD Package having a LED chip with side emission. Again, the thickness of the white coating is preferably less than 50% of the height of the LED chip, more preferably less than 25%, most preferred less than 10%.

The LED chip of FIG. 6 is mounted on a LED package carrier which in turn is soldered on e.g. a PCB.

According to further embodiments of the invention shown in FIGS. 9 to 13, the layer of reflective, preferably white material can be applied on the surface of the (optical) element arranged on top of the at least one LED chip.

Said element arranged on top of the LED chip can be a preferably hemispherical globe top 6 as shown in the first embodiment or in FIG. 9, the globe top being e.g. a resin deposited on top of a substrate 5 over the LED chip 4 and its wire bonds (not shown). Alternatively and according to the further embodiments of FIGS. 10 to 13, the element arranged on top of the LED chip may be a preformed or prefabricated optical element 7 disposed over the LED chip and preferably over its wire bonds. The preformed element 7 is preferably a lens and can have e.g. a hemispherical form (not shown) or a more rectangular shape, as the parallelepiped-shaped element of FIG. 12 disposed on top of the LED chip 4.

As already described above, the element arranged on top of the LED chip comprises preferably color conversion material or wavelength conversion material like phosphors for modifying and preferably down-converting the spectrum of the light emitted by the LED chip 4. A LED module comprising a blue LED chip emitting essentially blue light is thus able to emit a white light based on the color conversion.

Applying the layer of reflective material on the surface of the optical element arranged on top of the at least one LED chip has the effect that the reflectivity of the LED module can be enhanced.

A further advantage of such embodiments is that the spectrum of the resulting light emitted by the LED module can be controlled.

Even further, the reproducibility of the color temperatures among individual (white) LED modules or lamps can be improved.

FIG. 9 shows a further development of the embodiments of FIGS. 3 to 8. A layer of reflective material 8 is located between the substrate 5 and the globe top 6. An additional layer of reflective material 1 partially covers the globe top 6. A corresponding portion 3 of the globe top 6 is thus covered with the additional reflective material 1, and a corresponding portion 9 is not covered by said additional reflective material 1.

Light emitted by the LED chip 4 that is reflected by the additional reflective material 1 in the portion 3 of the globe top 6 will be further down-converted by the phosphor. Because of the reflection the blue converted light is reflected back into the color conversion element where at least some portion of the blue light is converted to a light having a lower wavelength, e.g. yellow light. Accordingly, the overall color conversion temperature decreases.

FIG. 10 shows a further embodiment comprising a preformed element 7 on top of the LED chip 4. The LED module consists of a blue LED die 4 placed on a substrate 5 with a color conversion element 7 placed above the LED chip or die 4. A preferably highly reflecting material 1 is placed on the substrate 5, partially covering also the color conversion element 7.

FIGS. 10 and 11 illustrate how the wavelength of the light emitted by the LED module can be controlled and how the reproducibility of the color temperatures among individual LED modules or lamps can be improved.

Adjusting the amount and/or height of the reflecting layer 1 allows for adjusting a desired light wavelength and/or color temperature. This can be done by taking a color conversion element 7 causing a wavelength modification or a color temperature that is preferably a little bit higher than the desired one, and adding said color conversion element 7 above the blue LED 4 as described above.

A first optional step consists in measuring the generated light wavelength and/or color temperature of the LED module. Then a preferably highly reflecting material 1, like e.g. reflecting particles in a silicone or another transparent matrix, can be deposited around the color conversion element 7 as can be seen in FIG. 10.

After measurement of the light wavelength and/or overall color temperature, it is decided whether or not further the wavelength has to be further down-converted. As long as the wavelength and/or color temperature is not comprised within a desired range, additional reflecting material 10 can be added step by step around a portion of the color conversion element that is not already covered by reflecting material, see FIG. 11.

The measurement of the overall light wavelength and/or color temperature can be repeated several times and additional reflecting material can be added step by step till a desired value or range of values is reached.

The reflecting material can consist of highly reflective particles embedded in a silicone matrix that is prone to degradation upon heating effects. In a preferred embodiment the volume fraction of the reflecting particles is chosen very low in order to overcome imperfections in the deposition of a small quantity of materials.

The reflecting material 1, 10 are deposited around the color conversion element 7 by dispensing, jetting or ink-jet printing. Alternatively, the highly reflective material is not deposited by dispensing or jetting but consists of a prefabricated highly reflective element that is integrated e.g. at the top surface of a reflector. While in embodiments comprising dispensed or jetted particles the wavelength of the emitted light can only be modified in one direction, i.e. can only either increased or decreases, an advantage of such prefabricated element is that the reflective material can be displaced or moved so as to cover more or less the color conversion element. The desired wavelength or color temperature can thus be increased or decreased such that the adjustment step may be carried out more easily.

The described adjustment method can be used to improve the reproducibility of individual LEDs or to control the color temperature during long time operation. Indeed phosphors that may be utilized in the color conversion element 7 are prone to slightly degrade during long time operation. The emitted wavelength and/or color temperature of the LED lamp can then be controlled e.g. by a detector unit (not shown) and subsequently adjusted to a desired value or to a desired range. The long time stability of a desired light wavelength and/or color temperature can in this way be guaranteed. The method can be also used e.g. when a LED lamp has to be replaced within an array of LED lamps during the lifetime of the LED array. By applying the present method it can be ensured that the replacing new LED lamp installed within the array matches, as desired, the light wavelength and/or color temperature of the replaced LED lamp or of the surrounding LED lamps for example. This is done by the adjustment step described above.

According to the embodiment of FIG. 12, the LED module comprises a LED die 4 placed on a substrate 5 and a color conversion element 7 on top of the LED die 4. Some portion of the emitted light is converted by the color conversion element 7, e.g. a sheet of a color conversion material, placed in the direction of the light emitted from the LED die 4. The actual color temperature of the light emitting device is measured and an adequate amount of reflecting material 1 is deposited at the bottom portion of the color conversion element 7 in order to obtain the desired light wavelength and/or color temperature.

In this embodiment, the substrate 5 is coated with reflective material 1 as well as the sides of the LED die 4 and lower parts of the color conversion element 7. Specifically, the lower surface 14 of the color conversion element 7 not covering the LED die 4 is coated. Additionally or alternatively, also lower sides 15 of the color conversion element 7 are coated with reflective material 1.

In another embodiment shown in FIG. 13, the LED module comprises a color conversion material 7 deposited within a housing 10 surrounding the LED die 4 that emits light in a first wavelength region. The housing 10 is made of a transparent material like silicone or glass. Again the color temperature of the light emitting device is measured. An adequate amount of a reflecting material 1 is then deposited outside of the housing 10, covering a bottom portion of the housing 10.

What is claimed is:

1. An LED module comprising:
   a printed circuit board (PCB) or a surface mounted device (SMD) carrier;
   an LED die mounted directly or indirectly to a top surface of the PCB or SMD carrier;
   an optical element arranged on top of the LED die; and
   a white reflective layer covering an area of the top surface of the PCB or SMD carrier which surrounds the LED die on which said optical element is arranged, the white reflective layer contacting sidewalls of the LED die;
   wherein the white reflective layer has a thickness that is less than a thickness of the LED die when viewing the LED module from a side, such that the white reflective layer does not extend above a top surface of the LED die when viewing the LED module from the side, and
   wherein the thickness of the white reflective layer is between 20 µm and 200 µm measured from the top surface of the PCB or the SMD carrier.

2. The LED module according to claim 1, wherein the thickness of the white reflective layer is between 100 µm and 150 µm.

3. The LED module according to claim 1, wherein the thickness of the white reflective layer is between 75% and 90% of the thickness of the LED die.

4. The LED module according to claim 1, wherein one or more lateral side walls of the LED die are coated with a material which is arranged to be reflective of light emitted onto the LED die.

5. The LED module according to claim 1, wherein a color conversion material is present in said optical element and/or on a top surface of the LED die.

6. The LED module according to claim 5, wherein the LED module emits a white light being a mixture of a spectrum of the LED die and an emission spectrum of color conversion material.

7. The LED module according to claim 1, wherein the white reflective layer is reflective at least for a spectrum emitted by the LED die and a color conversion material.

8. The LED module according to claim 7, wherein the LED module emits a white light being a mixture of the spectrum of the LED die and an emission spectrum of the color conversion material.

9. The LED module according to claim 1, wherein the white reflective layer is an electrically non-conducting material.

10. The LED module according to claim 1, wherein a plurality of LED dies are arranged under the optical element.

11. The LED module according to claim 10, wherein at least one LED die of the plurality of LED dies emits a spectrum which is partially down-converted by a phosphor, and at least one further LED die of the plurality of LED dies emits a spectrum which is unaffected by the phosphor.

12. The LED module according to claim 1, wherein the optical element comprises a globe top.

13. The LED module according to claim 1, wherein a white reflective material is applied on a housing surrounding the LED die and/or the optical element.

14. A retrofit LED lamp, comprising at least one LED module according to claim 1.

15. The LED module according to claim 1, wherein the white reflective layer provides an improvement in light output of at least 15% throughout a visible range.

16. An LED module comprising:
    a printed circuit board (PCB) or a surface mounted device (SMD) carrier;
    an LED die mounted directly or indirectly to a top surface of the PCB or SMD carrier;
    an optical element arranged on top of the LED die;
    a white reflective layer covering an area of the top surface of the PCB or SMD carrier which surrounds the LED die; the white reflective layer contacting sidewalls of the LED die;
    a white reflective material partially covering the optical element,
    wherein the white reflective layer has a thickness that is less than a thickness of the LED die when viewing the LED module from a side, such that the white reflective layer does not extend above a top surface of the LED die when viewing the LED module from the side.

17. An LED module comprising:
    a printed circuit board (PCB) or a surface mounted device (SMD) carrier;
    a support mounted to a top surface of the PCB or the SMD carrier;
    an LED die attached to the support;
    an optical element arranged on top of the LED die; and
    a white reflective layer covering an area of the top surface of the PCB or SMD carrier which surrounds the LED die, the white reflective layer contacting sidewalls of the LED die,
    wherein one or more dimensions of the support are equal to or smaller than one or more dimensions of the LED die when viewed from above,
    wherein one or more sidewalls of the LED die emit light, and
    wherein the white reflective layer has a thickness that is less than a thickness of the LED die when viewing the LED module from a side, such that the white reflective layer does not extend above a top surface of the LED die when viewing the LED module from the side.

18. The LED module according to claim 17, wherein the optical element comprises a color conversion material and/or a wavelength conversion material.

19. The LED module according to claim 17, wherein a color conversion material is on a top surface of the LED die.

20. The LED module according to claim 17, wherein the thickness of the white reflective layer is less than 50% of the thickness of the LED die.

21. An LED module comprising:
- a printed circuit board (PCB) or a surface mounted device (SMD) carrier;
- a support mounted to a top surface of the PCB or the SMD carrier;
- an LED die attached to the support;
- an optical element arranged on top of the LED die;
- and a white reflective layer covering an area of the top surface of the PCB or SMD carrier which surrounds the LED die, the white reflective layer contacting sidewalls of the LED die,
- wherein one or more dimensions of the support are equal to or smaller than one or more dimensions of the LED die when viewed from above,
- wherein an area of the support surrounding the LED die is recessed, wherein one or more sidewalls of the LED die emit light, and
- wherein the white reflective layer has a thickness that is less than 50% of a thickness of the LED die when viewing the LED module from a side such that the white reflective layer does not extend above a top surface of the LED die when viewing the LED module from the side.

22. The LED module according to claim 17, wherein the optical element comprises a color conversion material and/or a wavelength conversion material.

23. The LED module according to claim 17, wherein a color conversion material is on a top surface of the LED die.

* * * * *